United States Patent
Fastow et al.

(10) Patent No.: US 6,833,297 B1
(45) Date of Patent: Dec. 21, 2004

(54) METHOD FOR REDUCING DRAIN INDUCED BARRIER LOWERING IN A MEMORY DEVICE

(75) Inventors: Richard M. Fastow, Cupertino, CA (US); Yue-Song He, San Jose, CA (US); Nga-Ching Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/265,001

(22) Filed: Oct. 4, 2002

(51) Int. Cl.⁷ .......................................... H01L 21/8234
(52) U.S. Cl. .................. 438/217; 257/314; 257/315; 438/201; 438/211
(58) Field of Search .............................. 257/314–315; 438/201, 211, 217, 257

(56) References Cited

U.S. PATENT DOCUMENTS

| | | | | |
|---|---|---|---|---|
| 4,072,868 A | * | 2/1978 | De La Moneda et al. | 326/112 |
| 4,471,368 A | * | 9/1984 | Mohsen | 257/296 |
| 4,485,390 A | * | 11/1984 | Jones et al. | 257/404 |
| 4,819,043 A | * | 4/1989 | Yazawa et al. | 257/346 |
| 5,763,921 A | * | 6/1998 | Okumura et al. | 257/371 |
| 5,814,854 A | * | 9/1998 | Liu et al. | 257/315 |

\* cited by examiner

*Primary Examiner*—Allan R. Wilson

(57) ABSTRACT

The present invention is a method for fabricating a memory device. In one embodiment, a first impurity concentration is deposited in a channel region of a memory device. A second impurity concentration, which overlies the first impurity concentration, is then created in the channel region. Finally, a memory array is fabricated upon the channel region. The memory array overlies the first impurity concentration and the second impurity concentration.

8 Claims, 9 Drawing Sheets

300

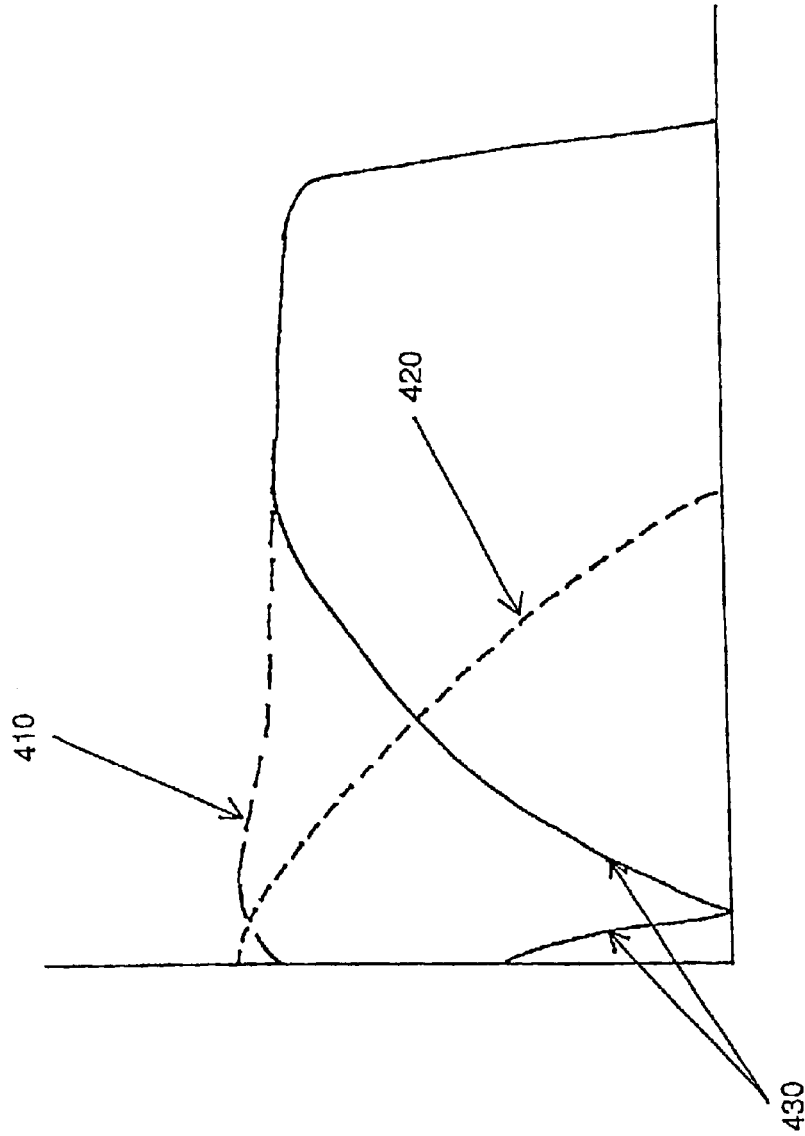

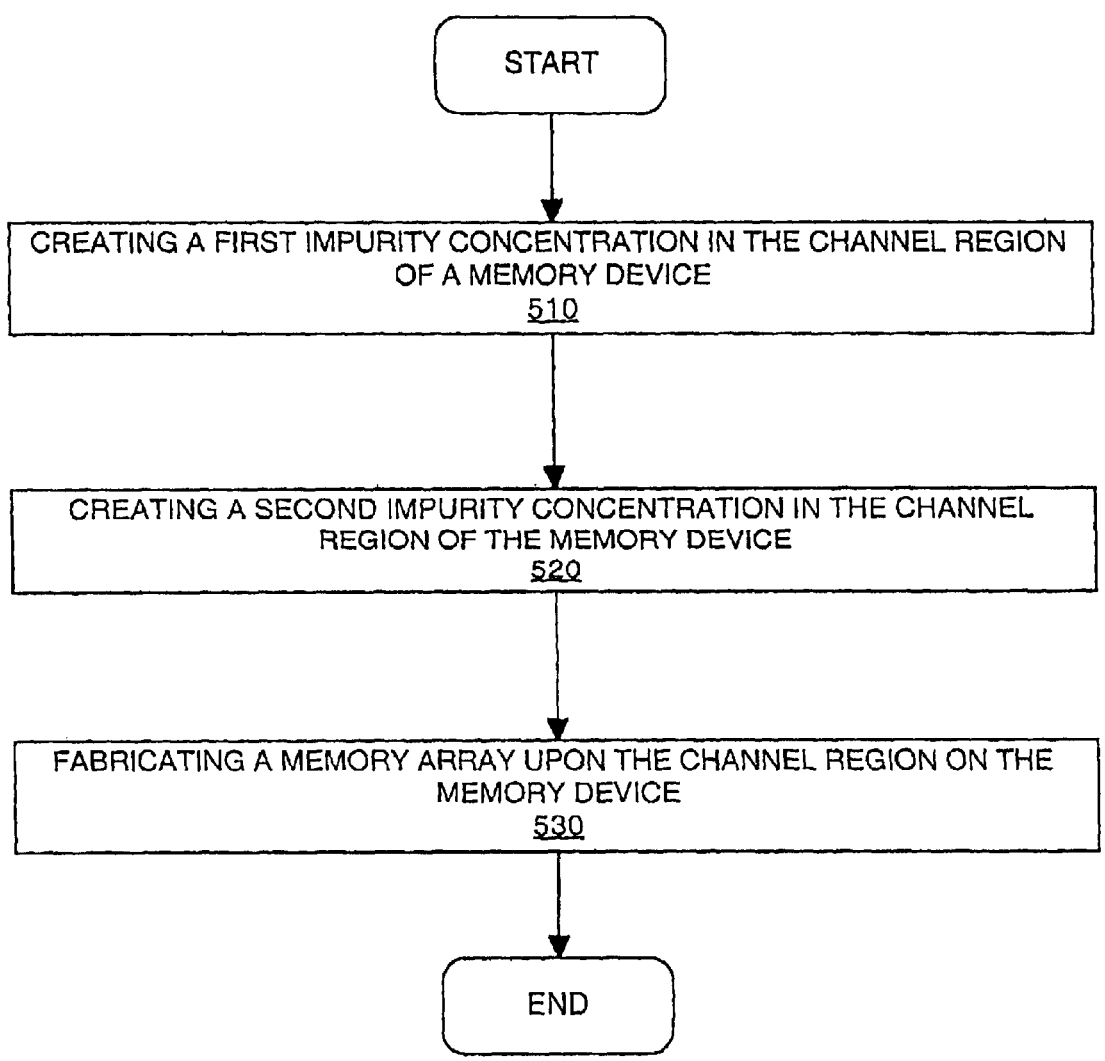

METHOD FOR REDUCING DRAIN INDUCED BARRIER LOWERING IN A MEMORY DEVICE

TECHNICAL FIELD

The present invention relates to the field of semiconductor fabrication. More specifically, embodiments of the present invention are directed to a method for reducing drain induced barrier lowering in a memory device.

BACKGROUND ART

Current technology trends are creating increasingly compact semiconductor structures in order to increase circuit density and to improve performance. One technique manufacturers use to scale down the size of semiconductor devices is to decrease the channel length between the source and drain areas. However, as channel length is decreased, device characteristics deviate from those derived from previous long-channel device approximations. These effects are commonly referred to as "short-channel effects."

FIG. 1 is an exemplary prior art programmable memory device. In device 100, a channel region 101 is the area of substrate 102 underlying the gate electrode structure 103. Gate electrode structure 103 comprises a control gate 104 disposed over an Oxide Nitride Oxide (ONO) stack 105. Control gate 104 is used to control memory device 100. Beneath ONO stack 105 is floating gate 106 and tunnel oxide layer 107. ONO stack 105 and tunnel oxide layer 107 insulate floating gate 106 which is the storage element of memory device 100. Memory device 100 further comprises source 108 and drain 109.

In a neutral state, there is no conductive path between source 108 and drain 109. When a positive voltage is applied to control gate 104 and drain 109, a conductive channel begins to form in channel 101 between source 108 and drain 109. When the voltage applied to control gate 104 is sufficiently large, the channel between source 108 and drain 109 is completely formed and electrons flow from source 108 and drain 109. The voltage at which the channel between source 108 and drain 109 forms is called the threshold voltage ($V_T$) of device.

Previously, in long-channel devices, conductance in the channel region was effectively controlled by applying a voltage to the gate. However, controlling unintended electrostatic interactions between the source and drain is more difficult to control in short-channel devices. In short-channel devices, as the drain bias is increased, the drain depletion region widens into the channel and can merge with the source depletion region. This results in punch-through leakage between the source and drain and loss of gate control over the device.

This encroachment of the depletion region from the drain into the channel is known as Drain Induced Barrier Lowering (DIBL). DIBL is one of the parameters used to measure the short channel effect in semiconductor devices, and is usually measured as the difference in a device's threshold voltage ($V_T$) when different drain biases are applied Strong DIBL is an indication of poor short channel device performance and is especially pronounced in devices with lightly doped substrates.

The increase in leakage current associated with DIBL is especially problematic in flash memory device as they are widely used in very low power applications, for example mobile phones, due to the ability of flash to retain information without applied power. Increases in leakage current may have a significant deleterious effect on total power consumption of the product using the flash device. Furthermore, as DIBL increases, it becomes increasingly difficult to program the memory cell. Therefore, controlling DIBL is becoming increasingly important as the scale of flash memory devices decreases.

The primary and conventional method for controlling DIBL is to increase the doping concentration in the channel area. This has the effect of slowing the encroachment of the drain depletion area into the channel as drain bias increases. However, higher doping concentrations in the channel necessitate using higher threshold voltages ($V_T$) to operate the device. This is undesirable because of the need for higher operating voltages and the increased difficulty in erasing the device which slows down erase operations.

Thus, current methods for controlling DIBL in short-channel memory devices are disadvantageous because they necessitate a loss in erase-time performance. Specifically, higher doping concentrations in the channel region necessitate higher operating voltages for the device which make erasing the device more difficult and, therefore, slower. Additionally, because semiconductor processing equipment is extremely expensive, any solution for reducing DIBL should be compatible with existing semiconductor processes and equipment without the need for revamping well established fabrication equipment or processes.

DISCLOSURE OF THE INVENTION

A method for fabricating a memory device which reduces drain induced barrier lowering is disclosed. In one embodiment, a first impurity concentration is deposited in a channel region of a memory device. A second impurity concentration, which overlies the first impurity concentration, is then created in the channel region. Finally, a memory array is fabricated upon the channel region. The memory array overlies the first impurity concentration and the second impurity concentration.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

FIG. 4 is an exemplary graph showing the doping profiles of regions within the channel region of a memory device fabricated in accordance with embodiments of the present invention.

FIG. 5 is a flow chart of a method for fabricating a memory device in accordance with embodiments of the present invention.

MODES FOR CARRYING OUT THE INVENTION

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
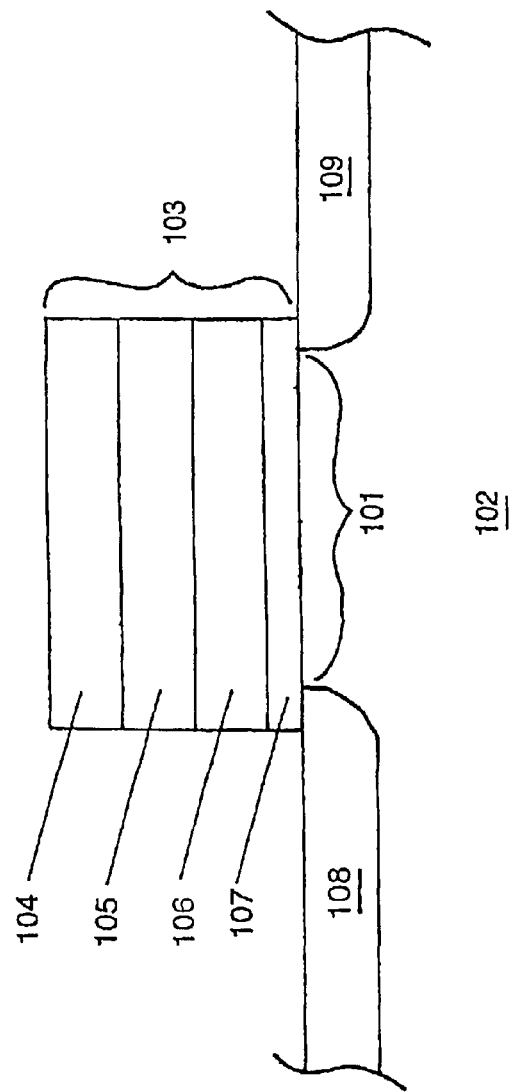
FIG. 1 is a cross section view of an exemplary prior art programmable memory device.
Figure 2:
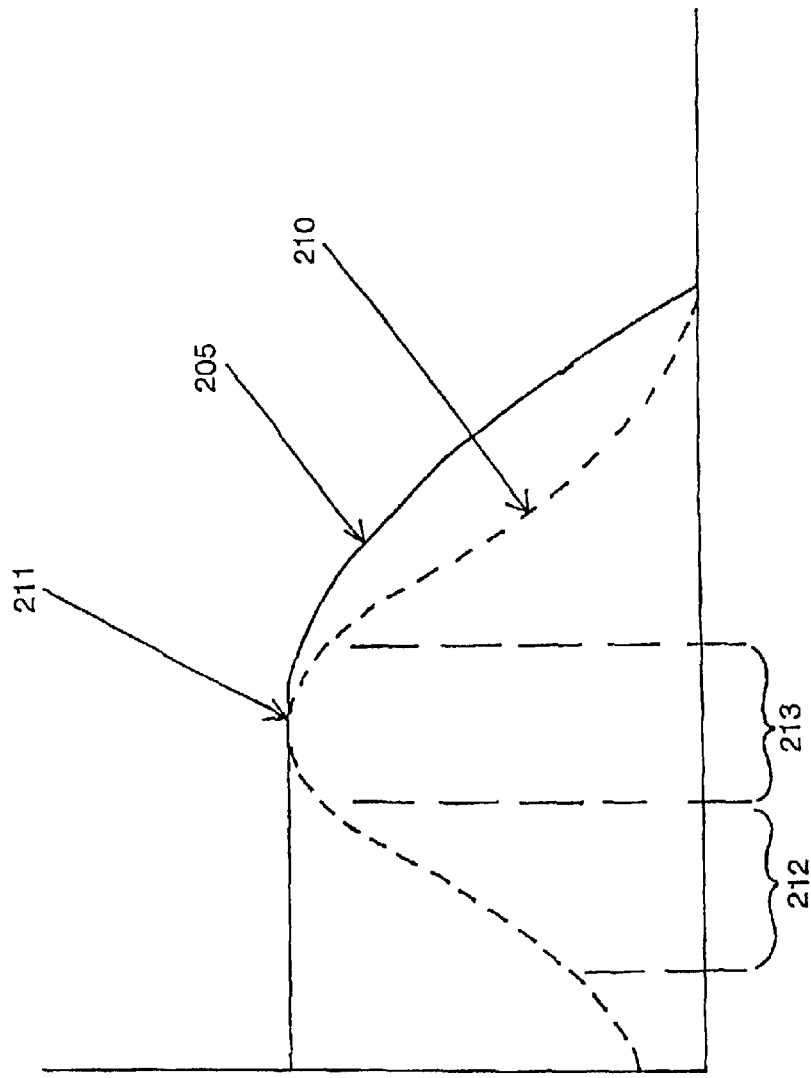
FIG. 2 is an exemplary graph showing the doping profile of a conventional well and a retrograde well.

FIG. 2 is an exemplary graph showing the doping profile of a conventional well (e.g., doping profile 205) and a retrograde well (e.g., doping profile 210). In FIG. 2, the impurity concentration is plotted on the Y-axis and implant depth is plotted on the X-axis. Doping profile 205 shows the doping concentration of a conventional well. As shown in FIG. 2, the doping profile for a conventional well indicates that the highest doping concentration occurs near the surface of the substrate and decreases as the depth of the well increases. Doping profile 210 show the doping concentration of a retrograde well. As shown in FIG. 2, the doping concentration of a retrograde well is initially low near the surface of the substrate and increases as the depth of the well increases to a peak density 211, at which point the doping concentration begins to decrease. Thus, in a typical retrograde well a region near the surface of the device (e.g., region 212 of FIG. 2) has a lower doping concentration than a region (e.g., region 213 of FIG. 2) which is further from the surface.

Retrograde wells are advantageous in many applications because they allow increased surface channel mobility in the region of low concentration (e.g., region 212 of FIG. 2) while the region of higher doping concentration (e.g., region 213 of FIG. 2) acts as a barrier against punchthrough.

FIGS. 3A–3E are cross section views of an exemplary memory device 300 fabricated in accordance with one embodiment of the present invention. In embodiments of the present invention, processes and procedures associated with shallow trench isolation (STI) have been previously performed upon a silicon substrate 301 to create STI wells (not shown). However, these and other processes have not been shown or described in detail so as to not unnecessarily obscure the present invention.

Figure 3A:
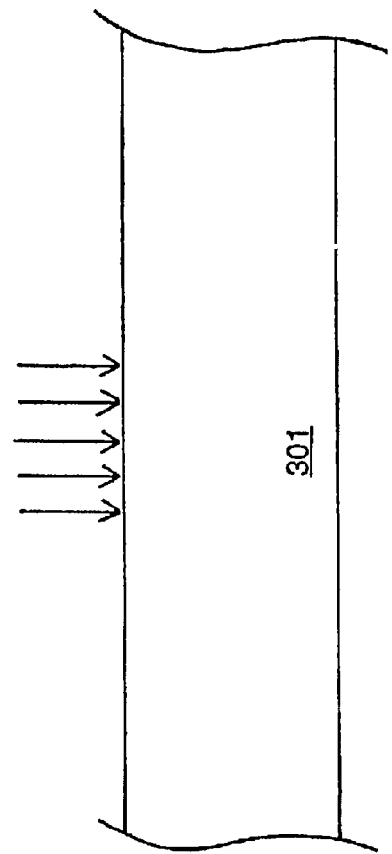
FIGS. 3A–3E are cross section views of an exemplary memory device fabricated in accordance with one embodiment of the present invention.

In FIG. 3A, a first operation is performed to introduce impurities into silicon substrate 301. In one embodiments the first operation is a P-type implant using, for example, boron. While the present embodiment recites a P-type boron implant, the present invention is well suited for using other materials as well. In embodiments of the present invention, subsequent processing steps may be performed such as a drive-in/anneal step which drives the dopant to the desired depth in silicon substrate 301.

Figure 3B:
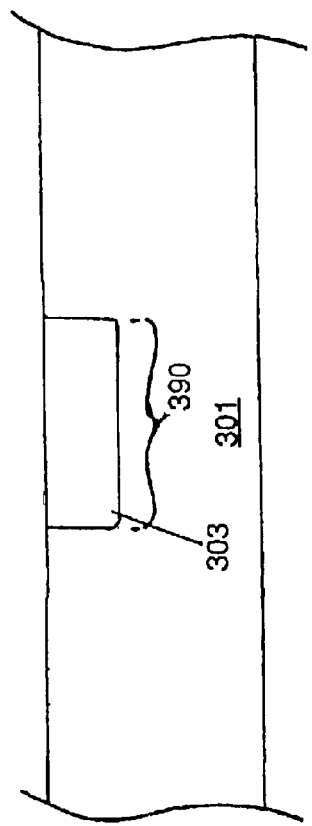

FIG. 3B shows a first impurity concentration 303 which has been created, as a result of the first implanting operation, in the channel region 390 of memory device 300. FIG. 4 is an exemplary graph showing the doping profile of the P-type implant of first impurity concentration 303 in accordance with embodiments of the present invention. In FIG. 4, the impurity concentration is plotted on the Y-axis and implant depth is plotted on the X-axis. Referring now to FIG. 4, doping profile 410 shows an exemplary doping profile of first impurity concentration 303 after the first implanting operation. As shown in FIG. 4, the doping concentration remains relatively uniform throughout most of first impurity concentration 303.

Figure 3C:
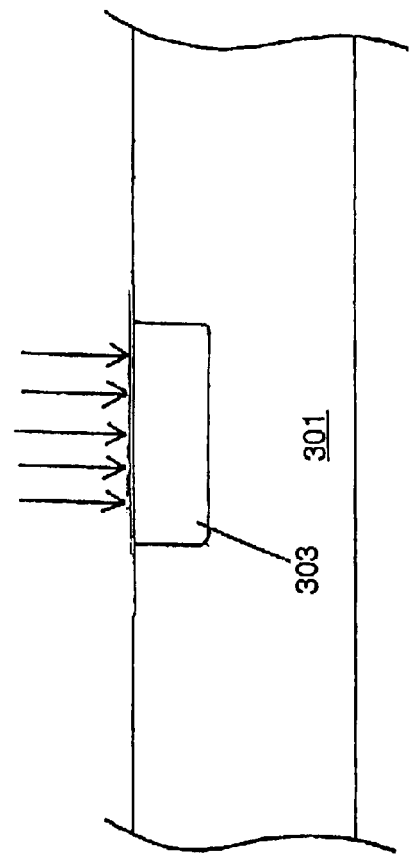

In FIG. 3C, a second operation is performed to introduce a second impurity into silicon substrate 301. In one embodiment, the second operation is an N-type implant using, for example, arsenic. While the present embodiment recites an N-type arsenic implant, the present invention is well suited for using other materials as well. In embodiments of the present invention, subsequent processing steps may be performed such as a drive-in/anneal step which drives the dopant to the desired depth in silicon substrate 301.

Figure 3D:
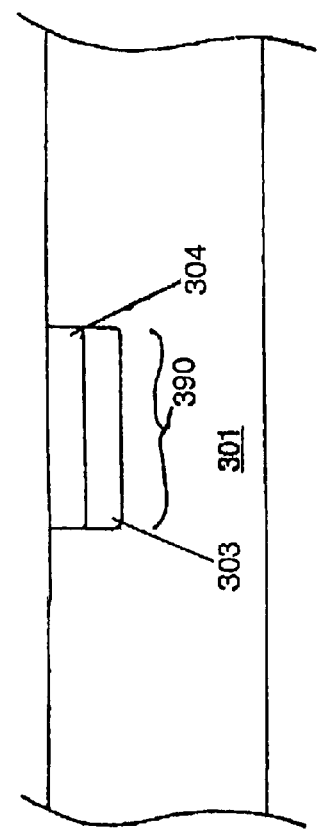

FIG. 3D shows a second impurity concentration 304 which has been created in channel region 390 as a result of the second implanting operation. Referring again to FIG. 4, doping profile 420 shows an exemplary doping profile of the N-type implant in area 304. As shown in FIG. 4, the doping concentration of the N-type implant decreases from its peak concentration at the surface of silicon substrate 301 to a value of zero at some depth within silicon substrate 301. Additionally, the P-type dopant remains in area 304 subsequent to the introduction of the N-type dopant into substrate 301. In other words, area 303 defines an area having a first impurity concentration in which the P-type dopant is present and area 304 defines in second area having a second impurity concentration in which both the P-type dopant and the N-type dopant are present.

Thus, the net doping profile in area 304 is a function the relative concentration of both of the dopants because the P-type and N-type dopants tend to counteract each other. However, in area 303 the N-type dopant is absent and the net doping profile mirrors the doping profile of the P-type dopant. By adjusting the doping concentrations of the implants, a retrograde well doping profile can be created in the channel region. FIG. 4 shows an exemplary net doping profile 430 of channel region 390. Near the surface of silicon substrate 301, net doping profile 430 has a low value because the dopants are present in substantially equal concentrations and effectively nullify each other. Thus, where the P-type dopant and the N-type dopant are present in equal concentrations (e.g., at point 450 of FIG. 4), the net doping profile becomes zero. As the doping concentration for the N-type dopant (e.g., doping profile 420 of FIG. 4) continues to decrease, net doping profile 430 increases as doping concentration the P-type dopant (e.g., doping profile 410 of FIG. 4) remains largely constant. Thus, the net doping profile of channel region 390 (e.g., doping profile 430 of FIG. 4) exhibits a retrograde well doping profile similar to doping profile 210 of FIG. 2. As stated above, a retrograde well benefits from increased surface channel mobility in the region of low concentration and acts as a barrier against punchthrough.

Figure 3E:
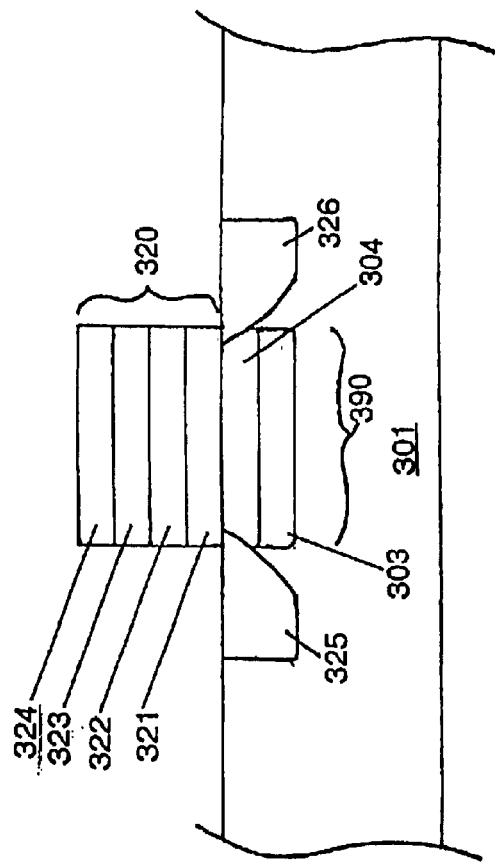

In embodiments of the present invention, standard fabrication processes and procedures are subsequently performed for creating a memory array upon channel region 390. For purposes of clarity these processes and procedures have been omitted in order to not unnecessarily obscure the present invention. FIG. 3E shows device 300 subsequent to fabrication steps which created a memory array 320 upon channel region 390 and which overlies impurity concentrations 303 and 304. In one embodiment, memory array 320 is a floating gate memory array comprising a tunnel oxide layer 321 and a floating gate layer 322. An insulating layer 323 separates floating gate layer 322 from control gate layer 324. Device 300 also comprises a source 325 and drain 326.

FIG. 4 is an exemplary graph showing the doping profiles of regions within the channel region of a memory device fabricated in accordance with embodiments of the present invention. In FIG. 4, the doping concentration is plotted on the Y-axis, and the implant depth is plotted on the X-axis. Doping profile 410 shows the doping concentration of boron which, in one embodiment, is implanted into silicon substrate 301 of memory device 300 to create first impurity concentration 303. Doping profile 420 shows the doping concentration of arsenic which, in one embodiment, is implanted in to silicon substrate 301 of memory device 300 to create second impurity concentration 304. Doping profile 430 shows the net doping profile of channel region 390. Net doping profile 430 displays the properties of a retrograde well doping profile in which the peak doping concentration is realized within the substrate rather than at its surface. In embodiments of the present invention, the doping concentrations of first impurity concentration 303 and second impurity concentration 304 are varied to create a retrograde well doping profile.

FIG. 5 is a flow chart of a method for fabricating a memory device in accordance with embodiments of the present invention. In step 510 of FIG. 5, a first impurity concentration is created in the channel region of a memory device. Referring again to FIG. 3B, first impurity concentration 303 is created in channel region 390 of memory device 300. In accordance with embodiments of the present invention, first impurity concentration 303 may be created by implanting boron in channel region 390.

In step 520 of FIG. 5, a second impurity concentration is created in the channel region of the memory device. Referring again to FIG. 3D, a second impurity concentration 304 is created in channel region 390 of memory device 300. In accordance with embodiments of the present invention, second impurity concentration 304 may be created by implanting arsenic in channel region 390. Additionally, second impurity concentration 304 overlies first impurity concentration 303 and is nearer to the top surface of silicon substrate 301. In embodiments of the present invention, both boron and arsenic are present in second impurity concentration 304. In embodiments of the present invention, a retrograde well doping profile is created by varying the doping profiles of the boron and arsenic in channel region 390. A retrograde well benefits from increased surface channel mobility in the region of low concentration and acts as a barrier against punchthrough. Furthermore, the method of the present invention is compatible with existing semiconductor manufacturing processes and equipment.

In step 530 of FIG. 5, a memory array is fabricated upon the channel region of the memory device. Referring again to FIG. 3E, memory array 320 is fabricated upon channel region 390. Memory array 320 overlies first impurity concentration 303 and second impurity concentration 304. In one embodiment, memory array is a floating gate memory array. However, while the present embodiment recites a floating memory array, the present invention is compatible with other types of memory arrays as well.

The preferred embodiment of the present invention, a method for reducing drain induced barrier lowering in a memory device, is thus described. While the present invention has been described in particular embodiments, it should be appreciated that the present invention should not be construed as limited by such embodiments, but rather construed according to the following claims.

What is claimed is:

1. A method for fabricating a memory device comprising:
    performing a P-type implant in a channel region of said memory device;
    performing an N-type implant in said channel region of said memory device which overlies said P-type implant and wherein said P-type implant and said N-type implant comprise a retrograde well; and
    fabricating a memory array upon said channel region of said memory device and overlying said P-type implant and said N-type implant.

2. The method for fabricating a memory device as recited in claim 1, wherein said performing said P-type implant comprises performing a boron implant in said channel region of said memory device.

3. The method for fabricating a memory device as recited in claim 1, wherein said performing said N-type implant comprises performing an arsenic implant in said channel region of said memory device.

4. The method for fabricating a memory device as recited in claim 1, wherein said fabricating of said memory array comprises fabricating a floating gate memory array upon said channel region.

5. A method for fabricating a programmable memory device comprising:
    performing a P-type implant in a channel region of said programmable memory device;
    performing an N-type implant in said channel region of said programmable memory device wherein a retrograde well is formed in said channel region; and
    fabricating a memory array upon said channel region of said programmable memory device.

6. The method as recited in claim 5, wherein said P-type implant comprises implanting boron in said channel region of said programmable memory device.

7. The method as recited in claim 5, wherein said N-type implant comprises implanting arsenic is said channel region of said programmable memory device.

8. The method as recited in claim 5, wherein said fabricating of said memory array comprises fabricating a floating gate memory array upon said channel region of said programmable memory device.

* * * * *